United States Patent [19]

Sato

[11] 4,366,449
[45] Dec. 28, 1982

[54] INTEGRATED VOLTAGE CONTROL VARIABLE GAIN CIRCUIT AND A SIGNAL TRANSMISSION CIRCUIT USING THE SAME

[75] Inventor: Tetsuo Sato, Fussa, Japan
[73] Assignee: Hitachi, Ltd., Tokyo, Japan
[21] Appl. No.: 152,295
[22] Filed: May 22, 1980

[30] Foreign Application Priority Data

Jun. 11, 1979 [JP] Japan .................................. 54-72290

[51] Int. Cl.³ .......................... H03G 3/10; H03F 3/68
[52] U.S. Cl. ..................................... 330/278; 330/295
[58] Field of Search ................ 330/278, 254, 295, 307

[56] References Cited

U.S. PATENT DOCUMENTS 4,155,047  5/1979  Rubens et al. ...................... 330/254

Primary Examiner—James B. Mullins
Assistant Examiner—Gene Wan
Attorney, Agent, or Firm—Antonelli, Terry and Wands

[57] ABSTRACT

An integrated voltage control variable gain circuit capable of exhibiting, when the external circuit network is connected in a first configuration, a low distortion factor of the output signal, and capable of effecting, when the external circuit network is connected in a second configuration, independent controls of gains for different two input signals. The integrated voltage control variable gain circuit is provided, in its integrated part, with a first operational amplifier circuit, a second operational amplifier circuit, a third operational amplifier circuit, a fourth operational amplifier circuit, a fifth operational amplifier circuit, a first gain control section and a second gain control section. The first operational amplifier circuit, the first gain control section and the third operational amplifier circuit are arranged in a first signal line, while, in the second signal line, arranged are the second operational amplifier circuit, the second gain control section and the fourth operational amplifier circuit. It is possible to select whether the fifth operational amplifier circuit is disposed on the second signal line, by selecting the configurations of the external circuit network.

10 Claims, 10 Drawing Figures

INTEGRATED VOLTAGE CONTROL VARIABLE GAIN CIRCUIT AND A SIGNAL TRANSMISSION CIRCUIT USING THE SAME

BACKGROUND OF THE INVENTION

The present invention relates to an integrated voltage control variable gain circuit and a signal transmission circuit using the same.

A voltage control variable gain circuit shown in FIG. 1 in which the gain is varied logarithmically linearly in accordance with changes in the control voltage Vc is known, as shown, for example, in a Japanese magazine titled NIKKEI ELECTRONICS (pp 118–140, Nov. 13, 1978).

In this known voltage control variable gain circuit, the inverting input terminal (−) of an operation amplifier circuit 21 is connected to an input terminal $T_{IN}$ while the non-inverting terminal (+) is connected to the grounding potential. The output $V_1$ from the operational amplifier circuit 21 is subjected to a level shift by batteries 22,23. Two voltages thus shifted are applied to emitters of PNP transistors $Q_2,Q_4$ and emitters of NPN transistors $Q_3,Q_1$. The bases of the PNP transistor $Q_2$ and the NPN transistor $Q_3$ are connected to the grounding potential, while the gain controlling voltage Vc is imposed on the bases of the PNP transistor $Q_4$ and the NPN transistor $Q_1$.

Thus, the base-emitter connections of four transistors $Q_1$–$Q_4$ are formed as a bridge circuit network among the circuit connection points $T_1,T_2,T_3,T_4$. The collector of the transistor $Q_1$ and the collector of the transistor $Q_2$ are connected to each other and then to the inverting input terminal (−) of the operational amplifier circuit 21. The collector of the transistor $Q_3$ and the collector of the transistor $Q_4$ are connected to each other then to the load resistance $R_L$.

The relationship between the input current $i_{in}$ and the output current $i_{out}$ in this known voltage control variable gain control circuit is given by the following equation, provided that factors of the transistors $Q_1$–$Q_4$ such as $V_{BE}$(voltage differential between base and emitter)-$I_E$(emitter current) characteristic, reverse saturation current $I_S$, current amplification factor and so forth are equal.

$$i_{out}/i_{in} = \exp q(-V_c)/KT \qquad (1)$$

Therefore, the output current $i_{out}$ is changed logarithmically linearly in accordance with the change of the control voltage Vc. A study made by the present inventors has clarified that, when this known voltage control variable gain circuit is formed into a semiconductor integrated circuit, the integrated voltage control variable gain circuit exhibits a high distortion factor because of the following reason.

The wave form of the voltages $VT_1$, $VT_3$ at the connection points $T_1$ and $T_3$ in the circuit of FIG. 1, in response to the output $V_1$ from the operational amplifier circuit 21, take the same phase, as will be understood from FIGS. 2(a) and 2(b).

On the other hand, in the semiconductor integrated circuit, the NPN and PNP transistors are usually made in the form of vertical type NPN transistor and lateral type PNP transistor in a monolithic semiconductor integrated circuit.

In the formation of the vertical type NPN transistor and lateral type PNP transistor in a semiconductor integrated circuit, as is well known to those skilled in the art from the disclosure of, for example, the specification of U.S. Pat. No. 3,197,710 entitled COMPLEMENTARY TRANSISTOR STRUCTURE, the introduction of P type impurity for forming the P type base region of vertical type NPN transistor and introduction of P type impurity for forming the P type emitter and collector of the lateral type NPN transistor are effected simultaneously. Also, the introduction of N type impurity for forming N+ type emitter region of vertical type NPN transistor is made simultaneously with the introduction of the N type impurity for the formation of N+ type base ohmic contact region of the lateral type PNP transistor.

It is, therefore, possible to form a plurality of vertical type NPN transistors and a plurality of lateral type PNP transistors in a single semiconductor integrated circuit by a comparatively simple method. On the other hand, in order to improve various characteristic parameters of the lateral type PNP transistor in the integrated circuit, it is possible to obtain a modified lateral type PNP transistors having an improved emitter injection efficiency by further introducing P type impurity at a high density into the P type emitter region. The PNP transistor of a circuit type grounded at the collector can be formed using a substrate type PNP transistor which makes use of the P type substrate of a bipolar integrated circuit as the collector region.

Therefore, the characteristic parameters of a plurality of NPN transistors formed in the integrated circuit conform at a comparatively high degree of accuracy, and similarly, the characteristic parameters of a plurality of PNP transistors formed in the integrated circuit conform at a comparatively high degree of accuracy. However, the average characteristic parameters of a plurality of NPN transistors and a plurality of PNP transistors do not conform with each other, because of differences in the construction and the manufacturing process.

As the examples of disconformity of the characteristic parameters between the NPN transistors and PNP transistors in the integrated circuit, it is possible to list disconformities of characteristic parameters which are quite important in the bipolar transistors such as base spreading resistance $r_{bb'}$, forward characteristic between base and emitter ($V_{BE}$–$I_E$ characteristic, emitter dynamic resistance $r_e$), common-emitter current amplification factor $h_{FE}$, cut-off frequency $f_T$ and so forth.

In the known voltage control variable gain circuit shown in FIG. 1, the conductivity of the PNP transistor $Q_4$ is increased during the period of positive half cycle of the voltage wave form $V_{T1}$ imposed on the circuit connection point $T_1$ to permit a collector current $i_4$ to flow through this transistor, whereas the NPN transistor $Q_3$ increases its conductivity in the period of negative half cycle of the voltage wave form $V_{T3}$ imposed on the circuit connection point $T_3$ to permit the collector current $i_3$ to flow therethrough.

The following disadvantages are brought about when this known voltage control variable gain circuit is constructed in the form of a semiconductor integrated circuit. Namely, the instantaneous value of the collector current $i_4$ of the PNP transistor $Q_4$ becomes smaller than the instantaneous value of the collector current $i_3$ of the NPN transistor $Q_3$, due to the discordance of the characteristic parameter between the PNP transistor and the NPN transistors, even if the instantaneous voltages of the positive and negative half cycles of the voltage wave form $V_{T1}$ and $V_{T3}$ are equal. In consequence, the instantaneous values of the wave form of the output current $i_{out}$ ($=i_3+i_4$) in the positive and negative half cycles are different. The difference of wave form of the output current $i_{out}$ between the positive and negative half cycles produces, across the load resistance $R_L$, an output $V_{out}$ of high distortion factor containing even higher harmonics of frequencies which are even number times as high as the frequency of the fundamental wave, as shown in FIG. 2d.

Namely, a distorted wave shape i having small instantaneous value i (+) of positive half cycle and large instantaneous value i (−) of negative half cycle is obtained. This distorted wave shape i can be developed into Fourier series as follows. It will be seen that this distorted wave shape includes even higher harmonics.

$$i = i_{(+)}\sin\omega t + \frac{i_{(-)} - i_{(+)}}{\pi} + \frac{2(i_{(-)} - i_{(+)})}{2}\sin\omega t -$$

$$\frac{2(i_{(-)} - i_{(+)})}{\pi}\left[\frac{\cos 2\omega t}{3} + \frac{\cos 4\omega t}{15} + \ldots + \frac{\cos 2n\omega t}{4n^2 - 1} + \ldots\right]$$
(2)

The present invention has been achieved on the basis of the inventor's study as explained above, in the course of development of an integrated voltage control variable gain circuit capable of providing a low distortion characteristic and applicable to a large variety of uses by a simple modification of the circuit network outside the integrated circuit.

Meanwhile, Japanese Patent Laid-open Publication No. 101859/1973 proposes to prepare two gain control circuits employing diodes, the two circuits being conected to both inputs of a differential amplifier to cancel the influences of higher harmonics, in order to reduce the higher harmonic distortion, particularly the secondary distortion, of the diode in a variable gain circuit making use of diodes.

Further, a technic similar to that proposed by the above-mentioned Japanese Patent Laid-open specification is disclosed in the specification of U.S. Pat. No. 4,155,047 registered on May 15, 1979.

SUMMARY OF THE INVENTION

It is, therefore, an object of the invention to provide an integrated voltage control variable gain circuit capable of exhibiting a low distortion characteristic of the output when the circuit network outside the integrated circuit is connected in a first configuration of connection and capable of effecting the gain controls on two inputs independently, when the external circuit network is connected in a second configuration of connection.

DESCRIPTION OF THE PREFERRED EMBODIMENTS

Figure 1:
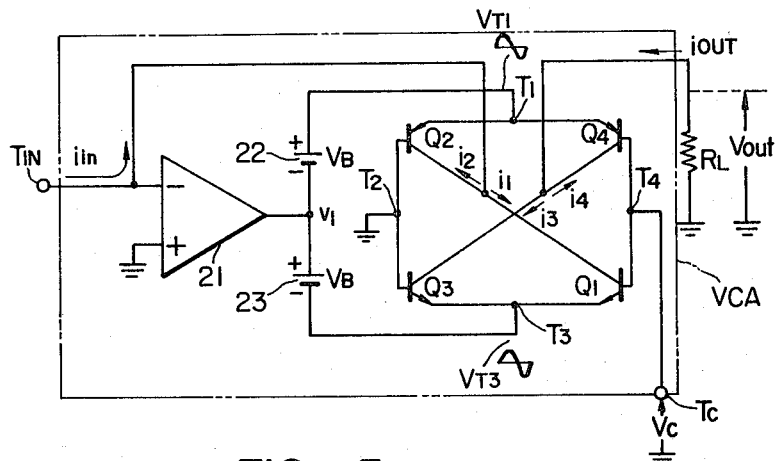
FIG. 1 is a circuit diagram of a known voltage control variable gain circuit.
Figure 3:
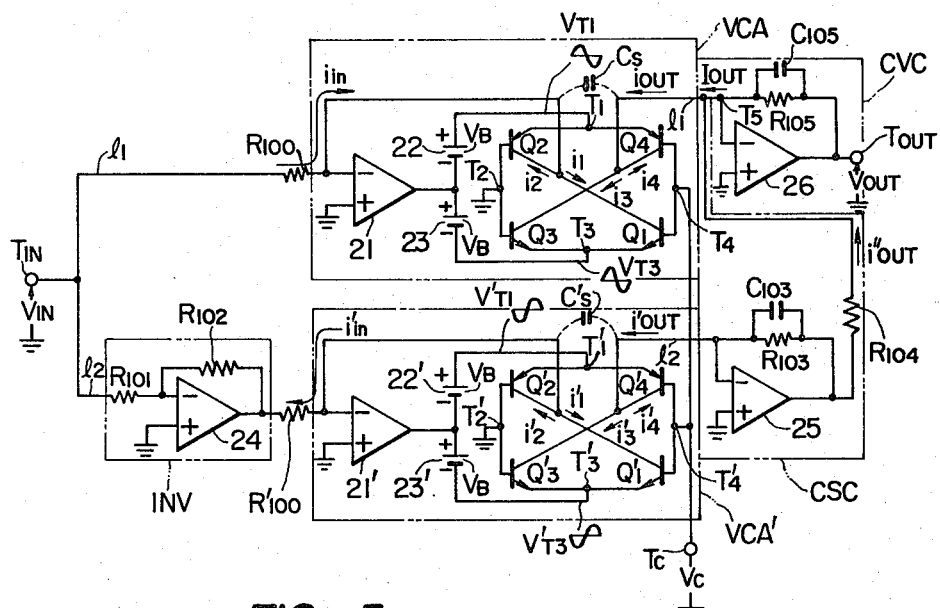
FIG. 3 shows a signal transmission circuit using a voltage control gain control circuit in accordance with fundamental embodiment of the invention.

FIG. 3 shows a signal transmission circuit using a voltage control variable gain circuit in accordance with a theoretical embodiment of the invention. A first gain controlling section VCA equivalent to the known voltage control circuit explained in connection with FIG. 1 is disposed in a first signal line $l_1$ between an input terminal $T_{IN}$ and output terminal $T_{OUT}$. A second signal line $l_2$ is connected between the input terminal $T_{IN}$ and the output terminal $T_{OUT}$, in parallel with the first signal line $l_1$. A second gain control section VCA' having an input/output transmitting characteristic substantially equal to that of the first gain control section VCA is connected in the second signal line $l_2$. The first and second gain control sections VCA and VCA' are controlled by the control voltage Vc imposed on the control terminal Tc. More specifically, the gain $V_{OUT}/V_{IN}$ is increased as a negative control voltage Vc is applied. To the contrary, the gain is lowered as a positive control voltage Vc is applied. The circuit arrangement and operation of the first and the second gain control sections VCA, VCA' are not described here, because they are materially identical to those of the known circuit shown in FIG. 1.

A resistance $R_{100}$ is connected between the input terminal $T_{IN}$ and the inverting input terminal (−) of the operational amplifier circuit 21, along the first signal line $l_1$. Therefore, the following relationship is established between the input voltage $V_{IN}$ and the input current $i_{in}$ flowing through the first gain control section VCA.

$$i_{in} = V_{IN}/R_{100}$$
(3)

In order to obtain a low distortion factor, it is desirable to maintain the input current $i_{in}$ at a low level. It is, therefore, desirable to select the resistance value of $R_{100}$ around 300 kΩ.

An inverter circuit INV is connected between the input terminal $T_{IN}$ and the inverting input terminal (−) of the operational amplifier circuit 21', along the second signal line $l_2$. The inverter circuit INV is constituted by an operational amplifier circuit 24, an input resistance $R_{101}$ connected to the inverting input terminal (−) and a feedback resistance $R_{102}$ connected between the output and the inverting input terminal (−). In order to make the voltage gain between the input and output of the inverter circuit INV equal to one, the resistances $R_{101}$ and $R_{102}$ take an equal resistance value such as 50 kΩ.

Therefore, the operational amplifier circuit 24 produces at its output a signal voltage of an inverted phase to the input voltage $V_{IN}$ and of the same amplitude as the latter.

A resistance $R'_{100}$ connected between the output of the operational amplifier circuit 24 and the inverting input terminal (−) of the second gain control section VCA' has a resistance value equal to that of the above-mentioned resistance $R_{100}$.

Therefore, the input current $i'_{in}$ flowing through the second gain control section VCA' has an inverse phase to the input current $i_{in}$ flowing through the first gain control section VCA and of the same amplitude as the latter.

Figure 4:
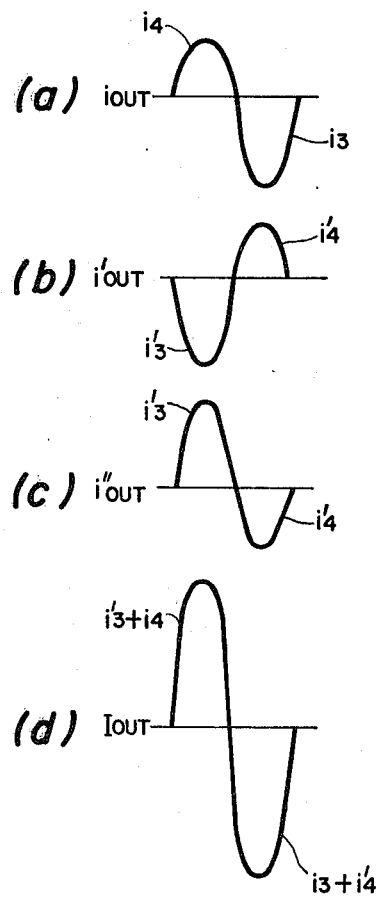
FIG. 4 is a wave form chart showing wave forms at various points in the circuit shown in FIG. 3.

Meanwhile, the output current $i_{out}$ from the first gain control section VCA has a wave form of a high distortion factor, due to discordance of the parameter between the NPN transistor and the PNP transistor, as shown in FIG. 4(a).

The voltage wave forms $V'_{T1}$, $V'_{T3}$ at the circuit connection point $T_1'$, $T_3'$ of the second gain control section VCA' have the inverse phases to the wave forms $V_{T1}$ and $V_{T3}$ at the circuit connection points $T_1$, $T_3$ of the first gain control section VCA, and amplitudes equal to those of the latter.

Therefore, in the second gain control section VCA', the NPN transistor $Q'_3$ increases its conductivity in the period of negative half cycle of the wave form $V'_{T3}$ to permit the collector current $i'_3$ to flow therethrough, while the PNP transistor $Q'_4$ increases its conductivity in the period of positive half cycle of the voltage waveform $V'_{T1}$ to permit the collector current $i'_4$ to flow therethrough.

The output current $i'_{out}$ from the second gain control section VCA' has an inverse phase relation to the output current $i_{out}$ from the first output control section VCA. The characteristic parameters of the NPN transistors $Q'_1$, $Q'_3$ of the second gain control section VCA' are materially identical to the characteristic parameters of the NPN transistors $Q_1,Q_3$ in the first gain control section VCA. Also, the characteristic parameters of the PNP transistors $Q'_2$, $Q'_4$ of the second gain control section VCA' are materially identical to those of the PNP transistors $Q_2,Q_4$ of the first gain control section VCA. Therefore, the collector current $i'_3$ in the NPN transistor is in inverted phase relation to the collector current $i_3$ of the NPN transistor and has equal amplitude to the latter, while the collector current $i'_4$ in the PNP transistor $Q'_4$ is in the inverse phase relation to the collector current $i_4$ in the PNP transistor $Q_4$ and has the same amplitude to the latter.

In consequence, the output current $i'_{out}$ from the second gain control section VCA' has a wave form as shown in FIG. 4(b).

This output current $i'_{out}$ is imposed on an inverting input terminal (−) of the operational amplifier circuit 25 in a current subtraction circuit CSC. A feedback resistance $R_{103}$ is connected between the output and the inverting input (−) of the operational amplifier circuit 25. The output voltage $V_{25}$ of this operational amplifier circuit 25 is given by the following equation.

$$V_{25} = R_{103} \cdot i'_{out} \qquad (4)$$

A resistance $R_{104}$ is connected between the output of the operational amplifier circuit 25 and the inverting input terminal (−) of the operation amplifier circuit 26.

The signal current $i''_{out}$ flowing through the resistance $R_{104}$ is determined by the following equation.

$$i''_{out} = \frac{V_{25}}{R'_{104}} = \frac{R_{103}}{R_{104}} \cdot i'_{out} \qquad (5)$$

Since the resistance value of the resistance $R_{104}$ is selected to be equal to the resistance value of the resistance $R_{103}$, the value of the signal current $i''_{out}$ is in the inverted relation to the output current $i'_{out}$ from the second gain control section VCA', as shown in FIG. 4(c).

A signal current $I_{OUT}$ which is the sum of the output current $i_{out}$ from the first gain control section VCA and the signal current $i''_{out}$ in the resistance $R_{104}$ flows through the terminal $T_5$ of the inverting input (−) of the operational amplifier circuit 26 of the current voltage conversion circuit CVC.

The current of positive half cycle of this signal current $I_{OUT}$ is the sum of the collector current $l'_3$ of the NPN transistor $Q_3'$ and the collector current $l_4$ of the PNP transistor $Q_4$, while the current of negative cycle is the sum of the collector current $l_3$ of the NPN transistor $Q_3$ and the collector current $i'_4$ of the PNP transistor $Q'_4$.

As has been described already, the amplitudes of the collector currents $i_3$ and $i'_3$ are substantially equal to each other, and the amplitudes of the collector currents $i_4, i'_4$ are almost equal to each other. Therefore, the amplitude of positive and negative half cycles of the signal current $I_{OUT}$ are substantially equal to each other as shown in FIG. 4(d), so that is is possible to obtain the signal current $I_{OUT}$ having a small distortion factor.

An output voltage given by the following equation is obtained at the output terminal $T_{OUT}$ of the circuit, because of the presence of a resistance $R_{103}$ connected between the output terminal and the inverting input terminal (−) of the operational amplifier circuit 26.

$$V_{OUT} = R_{105} \cdot I_{OUT} \qquad (6)$$

A frequency characteristic which is flat over a wide frequency range can be obtained by connecting capacitances $C_{103}$ and $C_{105}$ of a capacitance about 30 pF (at least 2 pF) in parallel with the resistances $R_{103}$ and $R_{105}$. A peaking will be generated at a high frequency range unless these capacitances are connected. This peaking is attributable to the leak of high-frequency current flowing through the resistances $R_{103}$ and $R_{105}$ via a stray capacitance $C_S$ (not greater than 1 pF) between the collectors of the input transistors $Q_1,Q_2$ ($Q_1',Q_2'$) and the output transistors $Q_3,Q_4$ ($Q_3',Q_4'$) of each gain control section. Since the compensation capacitances $C_{103}, C_{105}$ provide bypass paths for the high-frequency current, the peaking is eliminated to permit the frequency characteristic to become flat.

The above-described embodiment is not exclusive, and the invention can be embodied in various forms.

Figure 5:
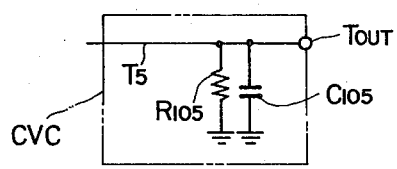
FIG. 5 is a circuit diagram of a current voltage conversion circuit.
Figure 2:
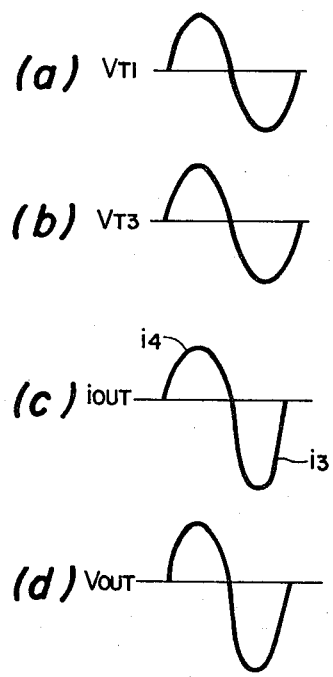
FIGS. 2a to 2d show various wave forms observed at various points in the circuit shown in FIG. 1.

For instance, it is possible to omit the operational amplifier circuit 26 of the current voltage conversion circuit CVC as shown in FIG. 5. For obtaining an output voltage $V_{OUT}$ of high level and small distortion factor, however, it is preferred to use the operational amplifier circuit 26.

Also, insteadly of applying the control voltage Vc, it is possible to apply a voltage −Vc in the reverse polarity to the bases of the transistors $Q_2,Q_3$ and $Q_2',Q_3'$.

Figure 6:
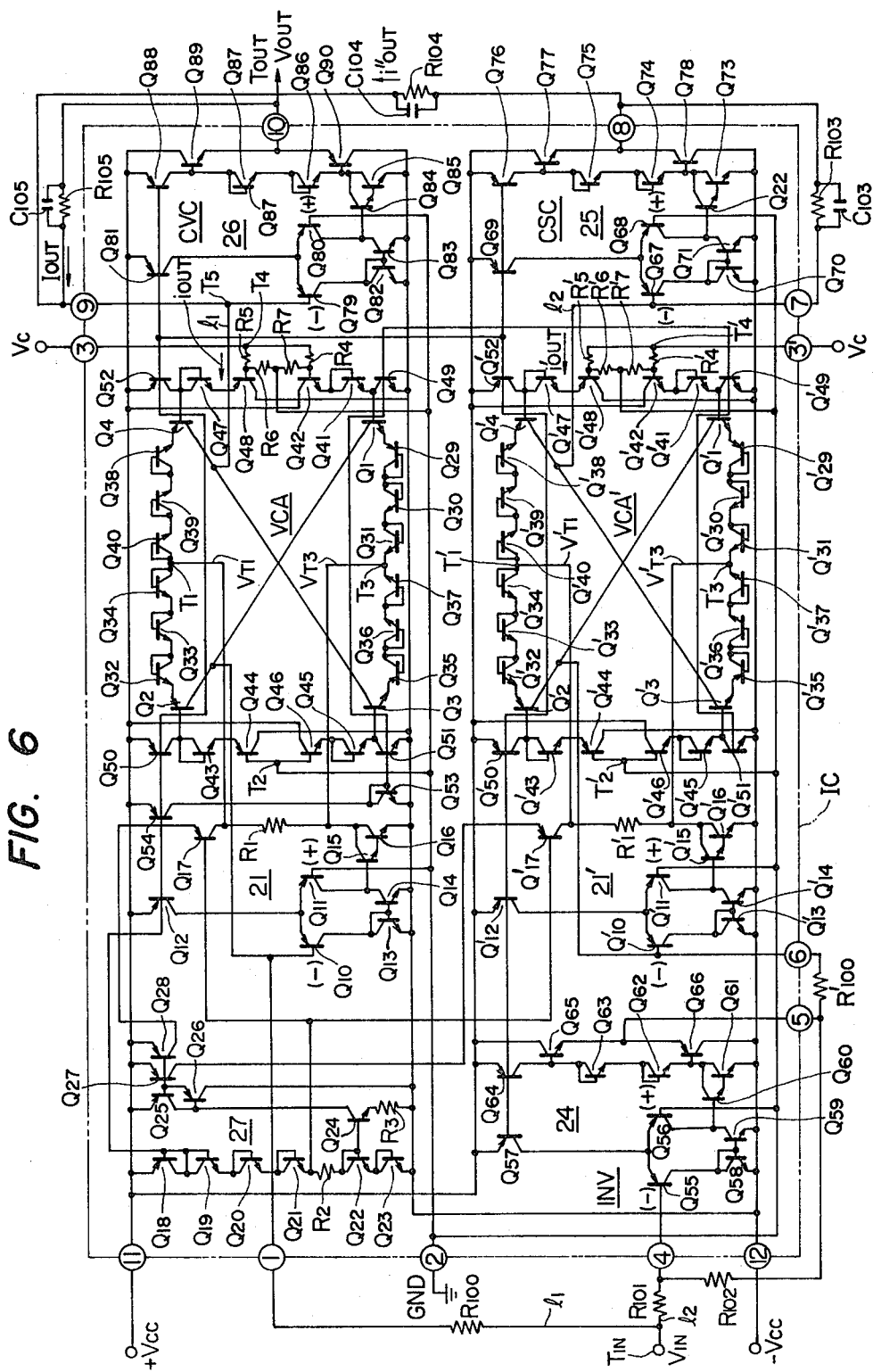
FIG. 6 shows a signal transmission circuit using an integrated voltage control variable gain circuit and connected to an external circuit network connected in a first configuration of connection.

FIG. 6 illustrates a practical embodiment of the present invention applied to a monolithic semiconductor integrated circuit. All of the elements in the broken line IC are formed in the silicon chip. Particularly, the NPN transistors and the PNP transistors are formed to have known vertical and lateral type constructions. In FIG. 6, the same reference numerals are used to denote the same circuits or circuit elements to those of FIG. 3. Reference numerals within circles show the terminal numbers of the integrated circuit.

In this embodiment, the circuit network outside the integrated circuit is connected in the first configuration of connection, in order to obtain a small distortion factor.

An operational amplifier circuit 21 is connected in the first signal line $l_1$ between the input and output terminals $T_{IN}$ and $T_{OUT}$. The operational amplifier circuit 21 is constituted by differential pair transistors $Q_{10},Q_{11}$, constant current transistors $Q_{12}$, current mirror transistors $Q_{13},Q_{14}$, Darlington connection transistors $Q_{15},Q_{16}$, biasing transistors $Q_{17}$, constant current transistor $Q_{25}$ and a level shift resistance $R_1$. The bases of the constant current transistors $Q_{12},Q_{23}$ are controlled by bias voltage generated by constant voltage and current regulator 27.

Although not exclusive, the regulator 27 is constituted by transistors $Q_{18}$–$Q_{25}$ and resistances $R_2$, $R_3$, and operates to adjust various biasing voltages and biasing currents in the integrated circuit.

The base of the transistor $Q_{10}$ is connected to one end of the resistance $R_{100}$ through a terminal 1 as the inverting input terminal (−) of the operational amplifier circuit 21, as well as to the collectors of the transistors $Q_1,Q_2$ of the first gain control section VCA. The base of the transistor $Q_{11}$ is connected to a grounding potential through the terminal 2 as the non-inverting input terminal (+) of the operational amplifier circuit 21. Since a constant current flows in the collector of the constant current transistor $Q_{17}$, two voltage signals $V_{T1},V_{T3}$ of the same phase of different levels are generated at both ends of the level shift resistance $R_1$, and are transmitted to the circuit connection points $T_1,T_3$ of the first gain control section.

As in the case of known circuit, the first gain control section VCA has four bridge transistors $Q_1, Q_2,Q_3,Q_4$ connected among four connection points of the circuit.

According to a preferred embodiment of the invention, series connections of diodes $Q_{29}$–$Q_{31}$, $Q_{32}$–$Q_{34}$, $Q_{35}$–$Q_{37}$ and $Q_{38}$–$Q_{40}$ are connected to the emitters of four transistors $Q_1$–$Q_4$. Since the A.C. resistance of this series connection diodes suppress the voltage gain for the noise voltages generated at the bases of the four transistors $Q_1$–$Q_4$, it is possible to obtain a high S/N ratio.

Each group constituted in accordance with the preferred embodiment of the invention constituted by four bridge transistors and the above-mentioned series connections of diodes contain three NPN transistors and one PNP transistor, so that it is possible to obtain a good matching of voltage-current characteristic in the forward direction between the groups, irrespective of the dispersion of characteristic parameters of the NPN transistors and PNP transistors in the integrated circuit.

The distortion factor of the output is further suppressed by this matching.

In general, when an equivalent diode constituted by N pieces of NPN transistors is connected in series to each of emitters of PNP transistors, an equivalent diode constituted by (N−1) pieces of NPN transistors and one PNP transistor should be connected to the emitter of each NPN transistor $Q_1,Q_3$.

According to a further preferred embodiment of the invention, the bases of the transistors $Q_1,Q_4$ are not directly connected to the circuit connection point $T_4$, and the bases of the transistors $Q_2,Q_3$ are not directly connected to the circuit connection point $T_2$. Rather, level shift elements $Q_{41}$–$Q_{48}$ are connected to the bases of the transistors $Q_1$–$Q_4$.

There is a fear that the gain control is not achieved completely, unless such level shift elements are not connected.

Namely, assuming that these level shift elements are omitted and that the equivalent diodes constituted by N pieces of transistors is connected to the emitter of each bridge transistor $Q_1$–$Q_4$, the control voltage Vc necessary for obtaining −10 dB chainge of gain between input and output sides is generally given by the following equation.

$$V_c = \frac{KT}{q} \times (N + 1)l_n10 \frac{-10}{20}$$

Supposing here that the number N of transistors is 4 (four), the above-mentioned control voltage is about 150 mV/10 dB, so that the control voltage has to be changed within the range of between 1.8 and 2.1 V for obtaining a change of gain over −120 and −140 dB. On the other hand, the D.C. potentials of collector of each of the bridge transistors $Q_1$–$Q_4$ are substantially equal to the ground potential, so that the transistor $Q_1$ is driven to the saturation region by such a large control voltage and, in some cases, a comparatively large current flows through the base junction of the transistor $Q_1$.

Namely, assuming here that such a level shift element is omitted, a positive control voltage Vc of about 1.8 V, which is more than twice of the forward voltage of the collector-base junction, is imposed on the base of the transistor $Q_1$, so that the base-collector junction of the transistor $Q_1$ and the collector-base junction of the transistor $Q_2$ are biased in the forward direction. Due to the forward biasing of the base-collector junction of each of the transistors $Q_1,Q_2$, a comparatively large D.C. current flows from the circuit connection point $T_4$ to the grounding potential point of the circuit connection point $T_2$, through the base-collector junctions of these transistors $Q_1,Q_2$.

Similarly, if a negative control voltage of about −1.8 V is imposed, comparatively large D.C. currents flow through base-collector junctions of the transistors $Q_3,Q_4$. The terminal voltage at the circuit connection point $T_4$ is clamped at a voltage level of 1.8 V or −1.8 V due to the flow of such comparatively large D.C. current, so that it becomes impossible to achieve a further gain control.

The level shift elements $Q_{41}$–$Q_{48}$ conveniently enhance the clamp voltage which limits the controllable range of the gain, so that the difference between the maximum gain and minimum gain can be increased.

According to a further preferred embodiment of the invention, a comparatively large constant current of about 50 μA flows, since constant current transistors $Q_{49},Q_{50},Q_{51},Q_{52}$ are connected to the level shift elements $Q_{41},Q_{42},Q_{43},Q_{44},Q_{45},Q_{46},Q_{47}$ and $Q_{48}$. The constant current flowing through these constant current transistors $Q_{49}$–$Q_{52}$ can be set by the bias current flowing in the transistors $Q_{53},Q_{54}$. Thus, by permitting a comparatively large constant current through the level shift elements $Q_{41}$-$Q_{48}$, the noises produced by four bridge transistors can be further suppressed. Here, the control voltage Vc is imposed on the bases of the transistors $Q_{42}$, $Q_{48}$ as the level shift elements, through the terminal 3 of the integrated circuit and the resistance circuit network $R_4$-$R_7$.

The inverter circuit INV disposed along the second signal line $l_2$ is constituted by an operation amplifier circuit 24, an input resistance $R_{101}$ and a feedback resistance $R_{102}$. The operation amplifier circuit 24 is constituted by differential pair transistors $Q_{55}$, $Q_{56}$, constant current transistor $Q_{57}$, current mirror transistors $Q_{58}$, $Q_{59}$, Darlington connection transistors $Q_{60}$,$Q_{61}$, idling current adjusting diodes $Q_{62}$,$Q_{63}$, constant current transistor $Q_{64}$ and push-pull output transistors $Q_{65}$,$Q_{66}$.

The base of the transistors $Q_{56}$ is connected to the grounding potential point through the terminal 2 of the integrated circuit as the non-inverting input terminal (+) of the operational amplifier circuit 24. The output from the operational amplifier circuit 24 is connected to the juncture between the resistances $R'_{100}$ and $R_{102}$ through the terminal 5.

The other end of the resistance $R'_{100}$ is connected through the terminal 6 of the integrated circuit to the base of the transistor $Q'_{10}$ which constitutes the inverting input terminal (−) of the operational amplifier circuit in the second gain control section VCA′. The operational amplifier circuit 21′ is equivalent to the operational amplifier circuit 21 which has been described already, and the second gain control section VCA′ is equivalent to the first one VCA which has been described already, so that the detailed descriptions concerning the operational amplifier circuit 21 and the second gain control section VCA′ are omitted here.

The output signal $i'_{out}$ from the second gain control section VCA′ is imposed on the base of the transistor $Q_{67}$ as the inverting input terminal (−) of the operational amplifier circuit 25 in the current subtraction circuit CSC. The terminals 7,8 of the integrated circuit constitute the inverting input terminal and the output terminal of the operational amplifier circuit 25, respectively. The detailed description of the operational amplifier circuit 25 is omitted because the latter has a construction similar to that of the operational amplifier circuit 24 of the inverter circuit INV.

As has been described already, the terminal 9 of the integrated circuit, i.e. the terminal $T_5$ of the inverting input (−) of the operational amplifier circuit 26 in the current voltage conversion circuit CVC receives the signal current $I_{OUT}$ which is the sum of the output signal $i_{out}$ from the first gain control section VCA and the signal current $i''_{out}$ in the resistance $R_{104}$. The operational amplifier circuit 26 of the current voltage conversion circuit CVC produces at its output terminal (terminal 10 of integrated circuit) an output voltage $V_{OUT}$ expressed by the foregoing equation (6) having a small distortion factor. The operational amplifier circuit 26 is not described in detail, because it has the same construction with the operational amplifier circuits 24,25 described before.

The terminals 11,12 of the integrated circuit receive the positive and negative power source voltages +Vcc and −Vcc, respectively.

As will be clearly understood from the foregoing description, according to the invention, the distortion attributable to the transmission characteristic between the input signal and an output signal of the first gain control section VCA can be cancelled in the signal subtraction circuit CSC, by the distortion produced by the second gain control section VCA having a transmission characteristic materially identical to that between the input and output of the inverter circuit INV and first gain control section VCA, so that a signal transmission characteristic of small distortion can be obtained.

On the other hand, according to the invention, it is possible to improve the noise characteristic also from the following reason.

The following equation for the maximum voltage gain G′V is derived from equations (3) and (6). This maximum gain is twice as large as the maximum gain GV ($=R_{105}/R_{100}$).

$$G'V = \frac{|V_{OUT}|}{|V_{IN}|} = \frac{|I_{OUT} \times R_{105}|}{|i_{in} \times R_{100}|} = \qquad (7)$$

$$\frac{|(i_{in} + i''_n) \times R_{105}|}{|i_{in} \times R_{100}|} =$$

$$\frac{|2i_{in} \times R_{105}|}{|i_{in} \times R_{100}|} = 2 \times \frac{R_{105}}{R_{100}}$$

In contrast, the total noise voltage $V_{NT}$ is given by the following equation in which the noise voltages produced by the first and second gain control sections VCA and VCA′ are represented by $V_{N1}$ and $V_{N2}$, respectively. Thus, the total noise voltage $V_{NT}$ is only $\sqrt{2}$ times as large as the noise voltage of a single gain control section.

$$V_{NT} = \sqrt{V_{N1}^2 + V_{N2}^2} \approx \sqrt{2} \cdot V_N \qquad (8)$$

$$(\because V_N \approx V_{N1} \approx V_{N2})$$

Thus, the S/N ratio can be reduced to $1/\sqrt{2}$ of the compared one to improve the noise characteristic.

As has been described, according to the invention, it is possible to obtain a signal transmission circuit of low distortion factor and low noise level, by using the integrated voltage control variable gain circuit and connecting an external circuit network in the first configuration of connection.

It is also possible to obtain a signal transmission circuit capable of effecting independent gain controls of two input signals by using the integrated voltage control variable gain circuit of the invention and connecting the external circuit network in the second configuration of connection.

More specifically, a voltage control variable gain circuit shown in FIG. 6 in the form of a monolithic semiconductor integrated circuit can be used as a variable gain circuit of a reduced price for stereophonic instruments.

Figure 7:
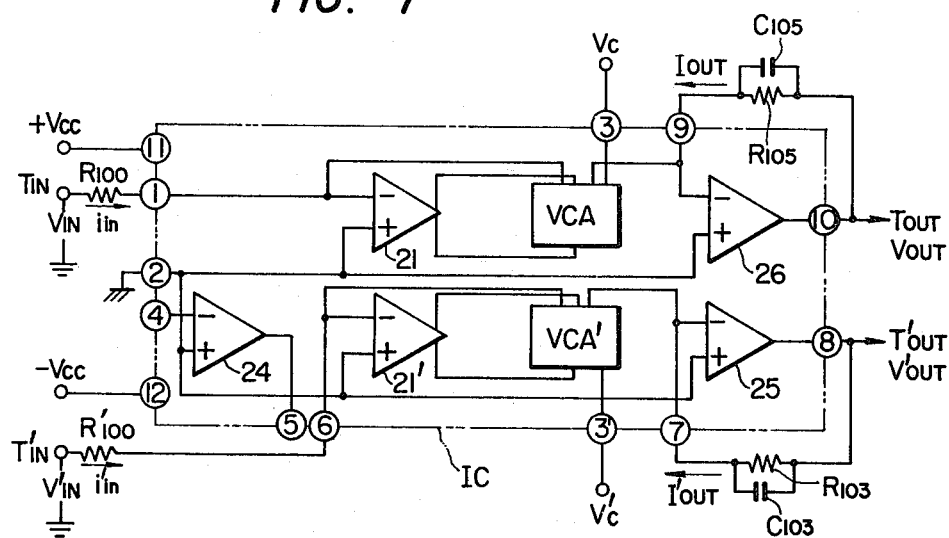
FIG. 7 shows another signal transmission circuit using an integrated voltage control variable gain circuit of another embodiment, connected to an external circuit network connected in the second configuration of connection.

Namely, as shown in FIG. 7, two channel signals $V_{IN}$, $V'_{IN}$ of left and right of the stereophonic instrument are imposed on two input terminals $T_{IN}$, $T'_{IN}$. The channel signal $V_{IN}$ applied to the input terminal $T_{IN}$ is transmitted to the output terminal $T_{OUT}$ through the terminal 1 of the integrated circuit, the operational amplifier circuit 21, the first gain control section VCA, the operational amplifier circuit 26 and the terminal 10 of the integrated circuit, as one $V_{OUT}$ of the left and right output signals of the stereophonic instrument. Meanwhile, the other channel signal $V'_{IN}$ imposed on the input terminal T′$_{IN}$ is transmitted to the output terminal T′$_{OUT}$, through the terminal 6 of the integrated circuit, the operational amplifier circuit 21′, the second gain control section VCA′, the operational amplifier circuit 25 and the terminal 8 of the integrated circuit, as the other V′$_{out}$ of the right and left output signals of the stereophonic instrument.

The gains of the first and second gain control sections VCA, VCA′ are independently controlled by means of the control voltages V$_C$,V′$_C$ imposed on the terminals 3,3′ of the integrated circuit.

The monolithic semiconductor integrated circuit shown in FIG. 6 can provide a variable gain circuit having a low distortion factor and high S/N ratio, by connecting the external peripheral circuit in the manner shown in FIG. 6. On the other hand, by connecting the external peripheral circuit in the form as shown in FIG. 7, it is possible to obtain a 2-channel variable gain circuit of a reduced price.

Accordingly, the monolithic semiconductor circuit shown in FIG. 6 has a high practicality because it can be used in two different ways by changing the configuration of connection of the external peripheral circuit.

The change of the external peripheral circuit can be made in a comparatively simple way. The integrated voltage control variable gain circuit has a high utility also from this point of view.

According to the general idea of the invention, the first and second gain control sections need not be always composed of four bridge transistors. For instance, it is possible to use a gain control section of differential current switching type gain control section, as shown in FIGS. 8 and 9.

Figure 8:
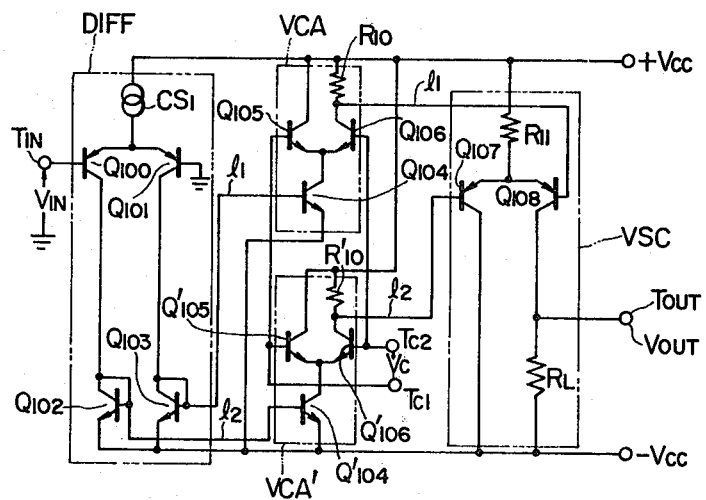
FIGS. 8, 9 and 10 show different embodiments of the invention.
Figure 9:
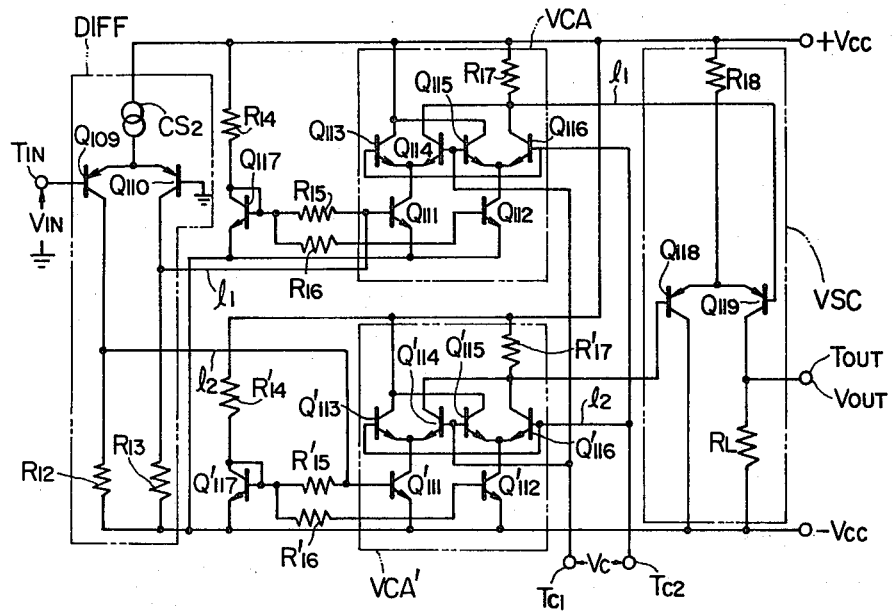

Namely, FIGS. 8 and 9 show modifications of the present invention, each having a differential input amplifier circuit DIFF. The differential input amplifier circuit DIFF is composed of a constant current source CS$_1$ or CS$_2$, differential transistors Q$_{100}$, Q$_{101}$ or Q$_{109}$,Q$_{110}$, and load means Q$_{102}$,Q$_{103}$ or R$_{12}$, R$_{13}$, and delivers to the first signal line l$_1$ a signal voltage of the same phase as the input voltage V$_{IN}$ imposed on the input terminal T$_{IN}$. At the same time, a signal voltage of the reverse phase is delivered to the second signal line l$_2$ by this differential input amplifier circuit DIFF. The amplitudes of two signal voltages of reverse phases on the first and second signal lines l$_1$, l$_2$ have to be equal to each other.

In the modification of FIG. 8, signal current flows in the collectors of the transistors Q$_{104}$,Q′$_{104}$, as these two signal voltages are applied to the base of the transistor Q$_{104}$ of the first gain control section VCA and the base of the transistor Q′$_{104}$ of the second gain control section VCA′. The ratio of distribution of signal current to the differential transistors is changed by means of the control voltage Vc imposed between the control terminals T$_{C1}$, T$_{C2}$ to control the magnitudes of the signal voltages generated across the resistances R$_{10}$ and R′$_{10}$.

In the modification shown in FIG. 9, two signal voltages of different phases on the first and second signal lines l$_1$, l$_2$ are imposed on the bases Q$_{111}$, Q′$_{111}$ of the first and second gain control sections VCA,VCA′, so that signal currents flow in the collectors of the transistors Q$_{111}$,Q′$_{111}$. The ratio of distribution of signal current to differential transistors is controlled by the control voltage Vc imposed between control terminals T$_{C1}$,T$_{C2}$ so that the magnitudes of the voltages generated across the resistances R$_{17}$ and R′$_{17}$ are controlled.

In the differential current switching type gain control section in which the ratio of current distribution to the differential transistors is controllable, the distortion of output signal is extremely small when the control voltage Vc applied between the control terminals T$_{C1}$ and T$_{C2}$ is substantially zero, because the characteristics of the differential pair transistors coincide with each other. However, as the control voltage Vc is increased to cause a large change of distribution ratio to the differential transistors, the output signal comes to include distortion component containing even higher harmonics, due to the influence of the base spreading resistance and the emitter series resistance.

The modifications shown in FIGS. 8 and 9 incorporates a voltage subtraction circuit VSC containing differential pair tansistors Q$_{107}$,Q$_{108}$ or Q$_{118}$,Q$_{119}$. The voltage subtraction circuit VSC cancels the distortions generated in the first and second gain control sections VCA and VCA′ with each other. It is, therefore, possible to obtain an output signal V$_{OUT}$ of a small distortion factor at the output terminal T$_{OUT}$.

Figure 10:
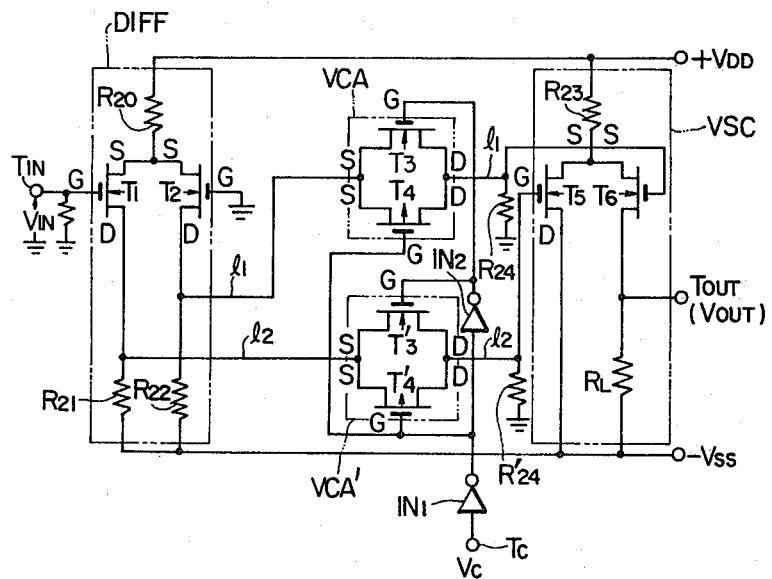

According to another modification in accordance with the general idea of the invention, the gains in the first and second gain control sections VCA,VCA′ can be controlled discontinuously by the control voltage Vc. This modification is shown at FIG. 10. The first and the second gain control sections VCA and VCA′ are constituted by analog switches including N channel MOSFETs T$_3$,T$_3$′ and P channel MOSFETs T$_4$,T$_4$′. In each CMOS analog switch, the sources (S) and drains (D) of the N channel and P channel MOSFETs are commonly connected such that the source-drain path of the N channel MOSFET and the source-drain path of the P channel MOSFET extend in parallel with each other along the first signal line l$_1$ or the second signal line l$_2$. The gates of the N channel MOSFETs T$_3$T$_3$′ and the gates of the P channel MOSFETs T$_4$,T′$_4$ are connected to each other through an inverter IN$_2$, and the gates of the P channel MOSFETs T$_4$,T′$_4$ are connected also to the control terminal Tc through an inverter IN$_1$.

The differential input amplifier circuit DIFF is constituted by a source resistance R$_{20}$, N channel differential MOSFETs T$_1$,T$_2$ and load resistances R$_{21}$, R$_{22}$, and is dapted to deliver to the first signal line l$_1$ a signal voltage of the same phase as the input voltage V$_{IN}$ imposed on the input terminal T$_{IN}$. The circuit DIFF also delivers a signal voltage of a reverse phase to the input voltage V$_{IN}$ to the second signal line l$_2$.

By selecting the values of the load resistances R$_{21}$,R$_{22}$ to be equal to each other, it is possible to set the amplitudes of signal voltages of reverse phases on the first and second signal lines l$_1$ and l$_2$ substantially equal to each other.

When a control voltage Vc of high level is imposed upon the control terminal Tc, the P channel MOSFETs T$_4$ and T$_4$′ are turned on by the output from the inverter IN$_1$ of low level, while the output from the inverter IN$_2$ of high level turns the N channel MOSFETs T$_3$,T$_3$′ on. In consequence, the first and second gain control sections VCA,VCA′ permit the signal transmission between the input an output sides to produce at the output terminal T$_{OUT}$ an output signal V$_{OUT}$ in response to the input signal V$_{IN}$. When the control voltage Vc of low level is imposed on the control terminal Tc, to the contrary, N channel MOSFETs T$_3$,T$_3$′ are turned off, as well as P channel MOSFETs T$_4$,T$_4$′, so as to prohibit the delivery of the output signal V$_{OUT}$ to the output terminal T$_{OUT}$.

However, when the N and P channel MOSFETs of the CMOS analog switch are turned on to permit the signal transmission from the input terminal $T_{IN}$ to the output terminal $T_{OUT}$, a distorted wave form having even higher harmonics, particularly a heavy secondary harmonic, is produced.

The voltage subtraction circuit VSC, including the source resistance $R_{23}$ and N channel differential MOSFETs $T_5, T_6$, act to permit the distorting components of the output voltages of the first and second gain control sections VCA,VCA', which are generated across the resistances $R_{24}, R_{24}'$, to cancel each other.

What is claimed is:

1. A voltage control variable gain circuit constructed as a semiconductor integrated circuit comprising:
   (a) a first operational amplifier circuit having an inverting input terminal, a non-inverting input terminal and an output terminal, said inverting input terminal leading out of said semiconductor integrated circuit to act as a first input terminal of said semiconductor integrated circuit, said non-inverting input terminal leading out of said semiconductor integrated circuit and connected to a reference potential;
   (b) a second operational amplifier circuit having an inverting input terminal, a non-inverting input terminal and an output terminal, said inverting input terminal leading out of said semiconductor integrated circuit to act as a second input terminal of said semiconductor integrated circuit, said non-inverting input terminal leading to the outside of said semiconductor integrated circuit and connected to said reference potential;
   (c) a first gain control section connected to said output terminal of said first operational amplifier circuit within said semi-integrated circuit and having an input terminal, a control input terminal and an output terminal, said input terminal being electrically connected to said inverting input terminal of said first operational amplifier circuit within said semiconductor integrated circuit, said control input terminal leading to the outside of said semiconductor integrated circuit to act as a first control input terminal of said semiconductor integrated circuit;
   (d) a second gain control section connected to said output terminal of said second operational amplifier circuit within said semiductor integrated circuit and having an input terminal, a control input terminal and an output terminal, said input terminal being electrically connected to said inverting input terminal of said second operational amplifier circuit within said semiconductor integrated circuit, said control input terminal leading to the outside of said semiconductor integrated circuit to act as a second control input terminal of said semiconductor integrated circuit;
   (e) a third operational amplifier circuit having an inverting input terminal, a non-inverting input terminal and an output terminal, said inverting input terminal being electrically connected to said output terminal of said first gain control section within said semiconductor integrated circuit and leading to the outside of said semiconductor integrated circuit, said non-inverting input terminal leading to the outside of said semiconductor integrated circuit and connected to said reference potential, and said output terminal leading to the outside of said semiconductor integrated circuit to act as a first output terminal of said semiconductor integrated circuit;
   (f) a fourth operational amplifier circuit having an inverting terminal, a non-inverting terminal and an output terminal, said inverting input terminal being electrically connected to said output terminal of said second gain control section within said semiconductor integrated circuit and lading to the outside of said semiconductor integrated circuit, said non-inverting input terminal leading to the outside of said semiconductor integrated circuit and connected to said reference potential, and said output terminal leading to the outside of said semiconductor integrated circuit to act as a second output terminal of said semiconductor integrated circuit; and
   (g) fifth operational amplifier circuit having an inverting input terminal, a non-inverting input terminal and an output terminal, said inverting input terminal leading to the outside of said semiconductor integrated circuit to serve as an optional input terminal for the semiconductor integrated circuit, said non-inverting input terminal leading to the outside of said semiconductor integrated circuit and connected to said reference potential, and said output terminal leading to the outside of said semiconductor integrated circuit to provide an external terminal to permit either the connection or disconnection of said fifth operational amplifier circuit to the inverting input terminal of the second operational amplifier circuit.

2. A signal transmission circuit incorporating the voltage control variable gain circuit claimed in claim 1, characterized by comprising:
   (h) a signal input terminal disposed at the outside of said semiconductor integrated circuit and adapted to receive an input signal;
   (i) a first input resistance disposed at the outside of said semiconductor integrated circuit and connected between said signal input terminal and said inverting input terminal of said first operational amplifier circuit;
   (j) a second input resistance disposed at the outside of said semiconductor integrated circuit and connected between said signal input terminal and said inverting input terminal of said fifth operational amplifier circuit;
   (k) a first feedback resistance disposed at the outside of said semiconductor integrated circuit and connected between said output terminal of said fifth operational amplifier circuit and said inverting input terminal of the same;
   (l) a third input resistance disposed at the outside of said semiconductor integrated circuit and connected between said output terminal of said fifth operational amplifier circuit and said inverting input terminal of said second operational amplifier circuit;
   (m) a second feedback resistance disposed at the outside of said semiconductor integrated circuit and connected between said output terminal of said third operational amplifier circuit and said inverting input terminal of the same;
   (n) a third feedback resistance disposed at the outside of said semiconductor integrated circuit and connected between said output terminal of said fourth operational amplifier circuit and said inverting input terminal of the same; and (o) a fourth input resistance disposed at the outside of said semiconductor integrated circuit and connected between said output terminal of said fourth operational amplifier circuit and said inverting input terminal of said third operational amplifier circuit.

3. A signal transmission circuit as claimed in claim 2, wherein said second input resistance and said first feedback resistance have resistance values substantially equal to each other, said first input resistance and said third input resistance have resistances values substantially equal to each other and said third feedback resistance and said fourth input resistance have resistance values which are substantially equal to each other.

4. A signal transmission circuit as claimed in claim 3, characterized by further comprising:
(p) a first compensation capacitance connected in parallel with said second feedback resistance at the outside of said semiconductor integrated circuit; and
(q) a second compensation capacitance connected in parallel with said third feedback resistance at the outside of said semiconductor integrated circuit.

5. A signal transmission circuit incorporating a voltage control variable gain circuit claimed in claim 1, characterized by comprising:
(h) a first signal input terminal disposed at the outside of said semiconductor integrated circuit and adapted to receive a first input signal;
(i) a second signal input terminal disposed at the outside of said semiconductor integrated circuit and adapted to receive a second input signal;
(j) a first resistance disposed at the outside of said semiconductor integrated circuit and connected between said first signal input terminal and said inverting input terminal of said first operational amplifier circuit;
(k) a second input resistance disposed at the outside of said semiconductor integrated circuit and connected between said second signal input terminal and said inverting input terminal of said second operational amplifier circuit;
(l) a first feedback resistance disposed at the outside of said semiconductor integrated circuit and connected between said output terminal of said third operational amplifier circuit and said inverting input terminal of the same; and
(m) a second feedback resistance disposed at the outside of said semiconductor integrated circuit and connected between said output terminal of said fourth operational amplifier circuit and said inverting terminal of the same.

6. A signal transmission circuit as claimed in claim 5, characterized by comprising:
(n) a first compensation capacitance connected in parallel with said first feedback resistance at the outside of said semiconductor integrated circuit; and
(o) a second compensation capacitance connected in parallel with said second feedback resistance at the outside of said semiconductor integrated circuit.

7. A signal transmission circuit as claimed in claim 6, wherein said first and second input signals are one and the other of left and right channel signals for a stereophonic instrument, whereby one and the other of the left and right channel output signals are derived from said first and second output terminals of said semiconductor integrated circuit.

8. A voltage control variable gain circuit as claimed in claim 1, wherein each of said first and second gain control sections includes at least a first circuit connection point, a second circuit connection point, a third circuit connection point, a fourth circuit connection point, a first transistor, a second transistor, a third transistor and a fourth transistor, the emitters of said second and fourth transistors being connected to said first circuit connection point, the bases of said second and third transistors being connected to said second circuit connection point, the emitter of said third and first transistors being connected to said third circuit connection point, the bases of said first and fourth transistors being connected to said fourth circuit connection point, the collectors of said first and second transistors being connected to each other within said semiconductor integrated circuit and further electrically connected within said semiconductor integrated circuit, as said input terminal of said first gain control section or said second gain control section, to said inverting input terminal of said first operational amplifier circuit or said second operational amplifier circuit, the collectors of said third and fourth transistors being connected to each other within said semiconductor integrated circuit and further electrically connected within said semiconductor integrated circuit, as said output terminal of said first gain control section or second gain control section, to said inverting input terminal of said third operational amplifier circuit or said fourth operational amplifier circuit, said output terminal of said first operational amplifier circuit or said second operational amplifier circuit being connected to said first and third circuit connection points electrically within said semiconductor integrated circuit, said second circuit connection point leading to the outside of said semiconductor integrated circuit, said fourth circuit connection point leading to the outside of said semiconductor integrated circuit to act as said control input terminal of said first gain control section or said second gain control section.

9. A voltage control variable gain circuit as claimed in claim 8, wherein each of said first and second gain control section further includes:
(h) a first level shift element connected between the emitter of said first transistor and said third circuit connection point;
(i) a second level shift element connected between the emitter of said second transistor and said first circuit connection point;
(j) a third level shift element connected between the emitter of said third transistor and said third circuit connection point;
(k) a fourth level shift element connected between the emitter of said fourth transistor and said first circuit connection point;
(l) a first level shift element connected between the base of said first transistor and said fourth circuit connection point;
(m) a sixth level shift element connected between the base of said second transistor and said second circuit connection point;
(n) a seventh level shift element connected between the base of said third transistor and said second circuit connection point; and
(o) an eighth level shift element connected between the base of said fourth transistor and said fourth circuit connection point.

10. A voltage control variable gain circuit as claimed in claim 8, wherein said first and third transistors are NPN transistors, while said second and fourth transistors are PNP transistors.

* * * * *